US009772097B2

(12) United States Patent
Bukkems et al.

(10) Patent No.: US 9,772,097 B2
(45) Date of Patent: Sep. 26, 2017

(54) EFFICIENT BOARD TO BOARD CONNECTION

(71) Applicant: PHILIPS LIGHTING HOLDING B.V., Eindhoven (NL)

(72) Inventors: Peter Johannes Martinus Bukkems, Eindhoven (NL); Machiel Willem Johan Peters, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/129,702

(22) PCT Filed: Mar. 16, 2015

(86) PCT No.: PCT/EP2015/055389
§ 371 (c)(1),
(2) Date: Sep. 27, 2016

(87) PCT Pub. No.: WO2015/144469
PCT Pub. Date: Oct. 1, 2015

(65) Prior Publication Data
US 2017/0153015 A1 Jun. 1, 2017

(30) Foreign Application Priority Data

Mar. 27, 2014 (EP) .................................... 14161911

(51) Int. Cl.
*F21V 23/06* (2006.01)
*H01R 12/52* (2011.01)
(Continued)

(52) U.S. Cl.
CPC .............. *F21V 23/06* (2013.01); *F21K 9/237* (2016.08); *F21K 9/238* (2016.08); *F21V 5/04* (2013.01);
(Continued)

(58) Field of Classification Search
None
See application file for complete search history.

(56) References Cited

U.S. PATENT DOCUMENTS 4,513,064 A * 4/1985 Marcus ................. H05K 3/366
361/803
6,241,531 B1 * 6/2001 Roath ..................... H01R 12/52
439/591
(Continued)

FOREIGN PATENT DOCUMENTS

CN 202834926 U 3/2013
CN 103047625 A 4/2013
(Continued)

*Primary Examiner* — Britt D Hanley
(74) *Attorney, Agent, or Firm* — Akarsh P. Belagodu

(57) ABSTRACT

A lighting device comprising a housing (102) with a driver electronics module (104) including driver circuitry for driving light sources and an electronics connector (106). The lighting device further comprising a circuit board (108) arranged in the housing, including a board connector (110). Furthermore lighting device comprises at least one light source (109) arranged on the circuit board and being in connection with the board connector, wherein the electronics connector and the board connector extend transverse to a planar extension of the circuit board. The board connector and the electronics connector are aligned so that they have an area of overlap, wherein the board connector and the electronics connector are biased against each other such that there is at least a line of contact which provides a galvanic connection, and wherein a heat induced electrical interconnection is provided along the line of contact. Such a connection is time- and cost efficient to assemble compared to a wire connection.

12 Claims, 3 Drawing Sheets

(51) Int. Cl.
   *H01R 13/24* (2006.01)
   *H01R 13/641* (2006.01)
   *H01R 4/02* (2006.01)
   *H01R 43/02* (2006.01)
   *H05K 3/36* (2006.01)
   *F21V 23/00* (2015.01)
   *F21V 5/04* (2006.01)
   *F21K 9/238* (2016.01)
   *F21K 9/237* (2016.01)
   *F21V 29/89* (2015.01)
   *F21Y 115/10* (2016.01)

(52) U.S. Cl.
   CPC ............ *F21V 23/005* (2013.01); *F21V 29/89* (2015.01); *H01R 4/02* (2013.01); *H01R 12/52* (2013.01); *H01R 13/24* (2013.01); *H01R 13/641* (2013.01); *H01R 43/02* (2013.01); *H05K 3/36* (2013.01); *F21Y 2115/10* (2016.08)

(56) References Cited

U.S. PATENT DOCUMENTS

| | | | |
|---|---|---|---|
| 7,638,814 B2 | 12/2009 | Wall, Jr. et al. | |
| 7,994,709 B2 | 8/2011 | Verjans | |
| 2008/0293262 A1* | 11/2008 | Duesterhoeft | H01R 12/78 439/65 |
| 2010/0159755 A1* | 6/2010 | Lin | H01R 9/091 361/679.01 |
| 2013/0003361 A1 | 1/2013 | Igaki et al. | |
| 2014/0028417 A1 | 1/2014 | Falchi et al. | |

FOREIGN PATENT DOCUMENTS

| | | |
|---|---|---|
| WO | WO2012095758 A1 | 7/2012 |
| WO | WO2013121479 A1 | 8/2013 |

\* cited by examiner

EFFICIENT BOARD TO BOARD CONNECTION

CROSS-REFERENCE TO PRIOR APPLICATIONS

This application is the U.S. National Phase application under 35 U.S.C. §371 of International Application No. PCT/EP2015/055389, filed on Mar. 16, 2015, which claims the benefit of European Patent Application No. 14161911.4, filed on Mar. 27, 2014. These applications are hereby incorporated by reference herein.

FIELD OF THE INVENTION

The present invention relates to electronic devices in general, and more specifically to board to board connections in electronic devices.

BACKGROUND OF THE INVENTION

In construction and design of electronic devices it is often advantageous to allocate electronic components in functional groups. Functional allocation may be one way of enabling modular design which in circuit board design can be used to speed up design by reusing modular circuit patterns for similar functions. Modular circuits are often allocated to share the same circuit board but for efficiency reasons or design constraint reasons it may be preferable to allocate different functional circuits to different boards. While this enables modular production of boards which for example have functional use in several different electronic products the assembly of products with multiple boards is generally slower and requires more steps compared to the assembly of single board electronic devices.

SUMMARY OF THE INVENTION

It is an object of the present invention to enable an electronic device with multiple circuit boards which is more energy- and cost efficient to produce.

According to the present invention, this and other objects are achieved by alighting device comprising a housing, a driver electronics module arranged in the housing, the driver electronics module including driver circuitry and an electronics connector configured to provide electrical access to said driver circuitry. The electronic device further comprises a circuit board arranged in the housing, the circuit board including a conducting path on a first side, and a board connector configured to provide electrical access to the conducting path. Furthermore the electronic device comprises at least one light source arranged on the circuit board and being in connection with the conducting path, wherein the electronics connector and the board connector each have a flat connection portion which extends in a direction (D) transverse to a planar extension of the circuit board. The connection portion of the board connector and the connection portion of the electronics connector are aligned so that they have an area of overlap, wherein the connection portion of the board connector and the connection portion of the electronics connector are biased against each other such that there is at least a line of contact which provides a galvanic connection, and wherein a heat induced electrical interconnection is provided along the line of contact.

An electronic device according to the present invention enables interconnection between two circuit boards which is quicker to assemble compared to for example board to board connections by wires, which requires soldering and is more complex to automate. Additionally an interconnection according to the present invention requires less applied force compared to conventional mechanical board to board connectors which usually have locking mechanisms and/or press fit locking. Each board according to the present invention may preferably be pre-produced with all connectors, wherein the heat induced interconnection is a single step interconnection which provides both a mechanical and an electrical connection.

Within the context of the invention a function adapted electronic component is a component which is adapted to perform at least one of the functions intended for which the circuit board was designed. For example this may be a microprocessor, a pulse width modulator for electric motor control or a light source such as a light emitting diode (LED). Similarly, an electronics module may be interpreted as a component comprising electronic components to provide a function or several functions, for example this may be a separate printed circuit board comprising electronic components for signal processing prior to passing the signals to the circuit board that the electronics module is connected to. An electronics module may just as well be a driver electronics module supplying the circuit board with power which is transformed from a power outlet to a voltage level and current for which the function adapted electronic components were constructed. Analogously the electronic circuitry may be driver circuitry adapted to provide a predetermined power supply, and electronic connectors may be called driver connectors to implicate where they are arranged.

According to one exemplary embodiment the electronic device is a lighting device, wherein the circuit board comprises at least one light source arranged on the circuit board and being in connection with the conducting path. The design is particularly advantageous for lighting devices, where the circuit board is preferably arranged for optimal light distribution and heat dissipation, and where the electronics module is a driver electronics module comprising driver electronics and is arranged at least out of the light distribution path. A design according to this embodiment of the invention may enable a short thermal path if the circuit board is arranged in closer contact with the housing compared to for example a conventional bulb-shaped light source with light emitting diodes.

The invention is advantageously useful in a retrofit lamp which may be flat compared to the conventional bulb shape. In recent years light sources with LEDs have grown more common as an alternative to traditional light bulbs.

Conventional LED retrofit lamps have the classic outer shape of a traditional light bulb. This LED lamp design is characterized by a horizontal split of functionality and commonly with wires as interconnectors. One half, the distal half from the socket, provides a light distribution chamber, where the LEDs are generally centrally placed on a circuit board oriented transversally to the main axis of the lamp. The components of the half closer to the socket are used as heat sinks to meet the thermal performance requirements. This product build-up describes a long thermal path from the LEDs where the heat is created to where the heat can be transferred, with many parts of the product involved including dedicated metal parts to enable this heat spreading function.

A lighting device according to the present invention, wherein the housing is arranged close to the circuit board, or even in connection to the circuit board, allows the housing to transfer heat directly from the circuit board. Furthermore, such a lighting device, with driver connectors and board connectors according to the invention would be quicker to assemble compared to a lighting device with the traditional light bulb design and wire interconnectors.

In one exemplary embodiment the board connector further comprises a mounting portion which is fixed in relation to the circuit board and which is resiliently connected to the connection portion by means of a resilient portion. By providing the board connector with a resilient portion connecting the mounting portion and the connection portion a tolerance against mechanical- and thermal stress is introduced. These tolerances enable lower risk of damages during assembly as well as improved component life expectancy once the interconnection is provided. Furthermore, the resilient portion may advantageously be formed to provide an improved tolerance in at least one predefined direction.

Similarly, in one exemplary embodiment the electronics connector further comprises a mounting portion which is fixed in relation to the driver electronics module and which is resiliently connected to the connection portion by means of a resilient portion. Analogously, the features and advantages of providing the electronics connector with a resilient portion connecting the mounting portion and the connection portion may be similar to those for the board connector.

The board connector may advantageously be formed in one piece of the same material. Similarly or independently the electronics connector may advantageously be formed in one piece of the same material. This enables a board connector and/or electronics connector which is/are cheaper to produce compared to connectors with multiple components. However, this does not exclude that each connector may for example be additionally coated or lacquered in some exemplary embodiments.

According to one embodiment the board connector is arranged at an outer edge of said circuit board. This arrangement facilitates alignment and support during an assembly process.

Furthermore, according to one embodiment the circuit board further comprises a second conducting path on a second side and a second board connector configured to provide electrical access to said second conducting path. The second board connector advantageously has a flat connection portion which extends in the direction (D), wherein the connection portion of the second board connector also is in electrical contact with the electronics connector, so that the first conducting path and said second conducting path are electrically connected via the electronics connector.

This enables a connection between two sides of a circuit board without the need for a plated hole or a wire which is soldered to opposite planar sides of a circuit board. Such plated holes and/or wires are more costly than this exemplary embodiment of the invention.

The board connector may advantageously be provided with a position indicating feature. Similarly, the electronics connector may advantageously also/independently be provided with a position indicating feature. In the context of the invention a position indicating feature may be understood as a structural and/or optical feature which is detectable by a sensor system for determining the position of the connector. Such a sensor system may be an optical system or a simpler trigger switch located at a predetermined position and being triggered by contact with a structural feature.

According to a second aspect of the invention, the object and other objects are achieved by a method for assembling a lighting device comprising the steps of providing a housing, and a driver electronics module arranged in the housing. The driver electronics module preferably includes driver circuitry and a electronics connector configured to provide electrical access to the driver circuitry, the electronics connector having a flat connection portion which extends in a direction (H); The method further comprises the step of providing a circuit board including a conducting path on a first side and at least one light source arranged on the circuit board and being in connection with the conducting path, and a board connector configured to provide electrical access to the conducting path, the board connector having a flat connection portion which extends in a direction (D) transverse to a planar extension of the circuit board; The method further comprises the step of aligning the circuit board and the housing so that the connection portion of the board connector and the connection portion of the electronics connector are parallel and aligned so that direction (D) is coaxial with direction (H); The method further comprises the step of assembling the circuit board with the housing along an axis defined by the direction (D) and direction (H) by moving the circuit board so that the connection portion of the board connector and the connection portion of the electronics connector are slidably biased against each other during the movement; And the method further comprises the step of joining the board connector to the electronics connector by means of a heat induced interconnection.

This method enables a quick assembly process by providing interconnectors which may be used in the alignment step. The connecting portions extending in direction (D) and direction (H) enable alignment in a third dimension compared to for example optical systems which may be used to detect features on a planar board to determine the position of the board. The board connector and/or the electronics connector may advantageously be used to improve determination of the position of the circuit board relative to the driver electronics module.

A further advantage of this method is provided by moving the circuit board relative to the driver electronics module along the coaxial directions (D) and (H), wherein the board connector and electronics connector are biased against each other, providing both support and further alignment during the assembly. Advantageously there is no or very little force required for this movement as this step may preferably be arranged so that the movement is vertical relative to the ground, wherein gravity may aid the movement and resting support.

Yet a further advantage compared to for example wire interconnection is the step of joining the interconnectors which may be performed with for example only a weld joint or solder joint without the need to support and/or bias one of the connectors against the other. Furthermore, the connectors may advantageously and sufficiently be joined at an interconnection line which is accessible from a position in the direction (D).

According to one exemplary embodiment of the invention the direction (H) is transverse to a planar extension of the driver electronics module. This enables the assembly and interconnection of a circuit board and an electronics module which are planary parallel to each other.

According to another exemplary embodiment of the invention the direction (H) is parallel with a planar extension of the driver electronics module. This enables the assembly and interconnection of a circuit board and an electronics module which are transverse to each other.

In the context of the invention it should be understood that the electronics connector and/or the board connector do not need to be 90° transverse to the planar extension of the circuit board. An inclination may be advantageous for the assembly, by allowing one connector to more easily slide along the other connector to the predetermined assembly position.

BRIEF DESCRIPTION OF THE DRAWINGS

The aspect of the invention, including its particular features and advantages, will be readily understood from the following detailed description and the accompanying drawings, in which.

DETAILED DESCRIPTION

Figure 1:
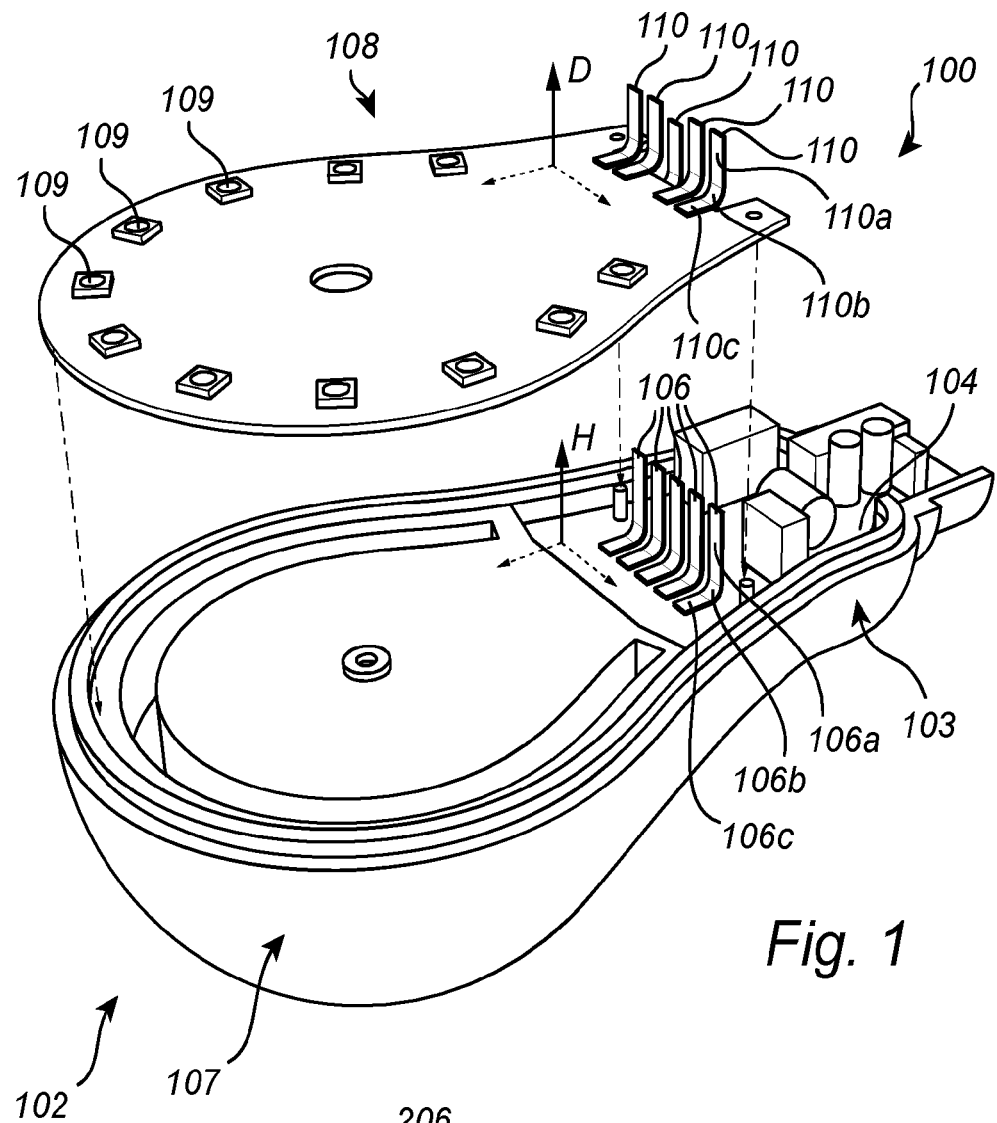
FIG. 1 illustrates an exploded view of an electronic device according to a preferred embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. For example, the invention according to one example embodiment is well suited for implementation in lighting devices such as retrofit lights, for replacement of common lightbulbs. However, the invention may be equally suited for use in any electronic device comprising two boards and interconnection between these boards.

For all FIGS. 1-8 like reference characters refer to like elements throughout.

FIG. 1 illustrates an exploded view of an electronic device according to a preferred embodiment of the present invention. More specifically the electronic device according to this preferred embodiment is a lighting device 100. The lighting device 100 comprises a housing 102, which in FIG. 1 is illustrated by only one half, wherein the planar split is made along the primary axis of the lighting device 100. In FIG. 1 this planar split forms the horizontal plane. The second half of the housing 102, which is not shown, is preferably essentially symmetrical to the half shown in FIG. 1. The housing 102 has a horizontal half cylindrical shaped hollow section 103 in one end, which forms part of the portion of the lighting device 100 adapted to mate with the light bulb socket. The cavity defined by the hollow cylindrical shaped section 103 is adapted to receive a driver electronics module 104. The driver electronics module 104 comprises a circuit board having electronic components and circuitry for driving a light source by converting the current supplied through the light bulb socket. Such components and circuitry may typically be significantly larger than for example a light emitting diode. The planar extension of the board of the driver electronics module 104 is parallel with the plane along which the housing is split, wherein large components and circuitry may fit in the cavity formed on both sides of the driver electronics module 104. On the end of the module 104 facing the centre of the lighting device 100 the driver module 104 comprises a plurality of electronics connectors 106 arranged on the board of the driver electronics module 104. Each driver connector 106 illustrated in FIG. 1 is essentially formed in the shape of a reversed L facing the centre of the lighting device 100. The lower part of the L-shape is surface soldered to the board of the driver module while the upper part of the L-shape extends in a direction (H) transverse to the board of the driver electronics module 104 and forms a connection portion 106a. With reference to FIG. 1 the driver connectors 106 have reversed L-shapes if viewed from the side with the plane of the split forming the horizontal line and if the driver electronics module 104 is to the right of the centre of the lighting device 100. The extension of each driver connector 106 in the direction (H) is equidistant and from the perspective of the centre of the lighting device the connection portions 106a are flat as the driver connectors illustrated in FIG. 1 are formed in one continuous strip of conducting material with resilient properties, for example nickel. The bend of the L-shape provides a resilient portion 106b connecting the connection portion 106a to the lower end of the L-shaped connector, the mounting portion 106c. The resilient portion 106b is formed such that it may absorb some stress by bending in a resilient manner, so that for example the stress resulting from a force on the connection portion 106a, affecting the solder connection between the driver electronics module and the mounting portion 106c is at least partly relieved.

The other, distal end 107 of the housing 102 in FIG. 1 is formed in the shape of a racquet head, parallel to the horizontal plane, and preferably it comprises a light distributing lens shape and a heat transferring portion. The heat transferring portion is adapted to receive and be in close thermal contact with a circuit board 108. The circuit board 108 is planar and parallel to the horizontal plane, and similarly to the distal end 107 of the housing 102, the circuit board is shaped as a racquet head. When the lighting device 100 is assembled the circuit board 108 will be arranged so that a portion of the edge of the circuit board 108 will overlap the driver electronics module 104 slightly at a small offset distance in the direction (H). A plurality of light sources 109, light emitting diodes (LED), are arranged on both planar sides (one side not shown in FIG. 1) of the circuit board 108, so that they are arranged to a light distributing lens shape in the housing 102 when assembled. The circuit board is provided with a plurality of board connectors 110 similar to the driver connectors 106 found on the driver electronics module. The board connectors according to this exemplary embodiment are also formed in one continuous strip of conducting material with resilient properties, each having a connection portion 110a connected to a mounting portion 110c via a resilient portion 110b in the form of a bend. Additionally, the board connectors 110 are arranged on the outer edge of the circuit board which is facing the driver electronics module 104, their connection portions 110a extending in a direction (D) parallel with direction (H) and with the mounting portions 110c the board connectors 110 define reversed L-shapes which extend slightly outside the edge of the circuit board. The board connectors 110 are individually aligned to a driver connector 106 so that when the lighting device 100 is assembled the connection portions 110a of the board connectors 110 and the connection portions 106a of the driver connectors will pair wise have an area of overlap and be resiliently biased against each other. Furthermore, the circuit board 108 in the exemplary embodiment illustrated in FIG. 1 is provided with one board connector, which mounting portion (not shown) is arranged on the planar side of the circuit board opposite to the other board connectors. While the connection portion of this board connector has the same length as the other board connectors and essentially a parallel extension in direction (D), the mounting on the opposite planar side of the circuit board results in that the extension of this board connector's connection portion is shorter in the direction (D). However, the connection portions 106a of the driver connectors 106 extend with a sufficient length in direction (H) so that when the lighting device 100 is assembled the ends of the driver connectors 106 are level with the ends of the board connectors 110 arranged on the planar side visible in FIG. 1. The end of the board connector arranged on the opposite side (not shown) rests slightly lower on the connection portion of the driver connector to which it is paired.

Furthermore, both planar sides of the circuit board 108 are provided with a conducting path respectively, the conducting paths (not shown) being for example conductive tracks, pads or other features etched from copper sheets laminated onto a non-conductive substrate forming the circuit board. These conducting paths connect the plurality of light sources 109 with the board connectors 110. Similarly, the driver electronics module is provided with conducting paths (not shown) connecting the driver connectors to the driver circuitry and alternatively interconnecting two driver connectors so that an interconnection between two board connectors arranged on opposite sides of the circuit board 108 is enabled.

Figure 2:
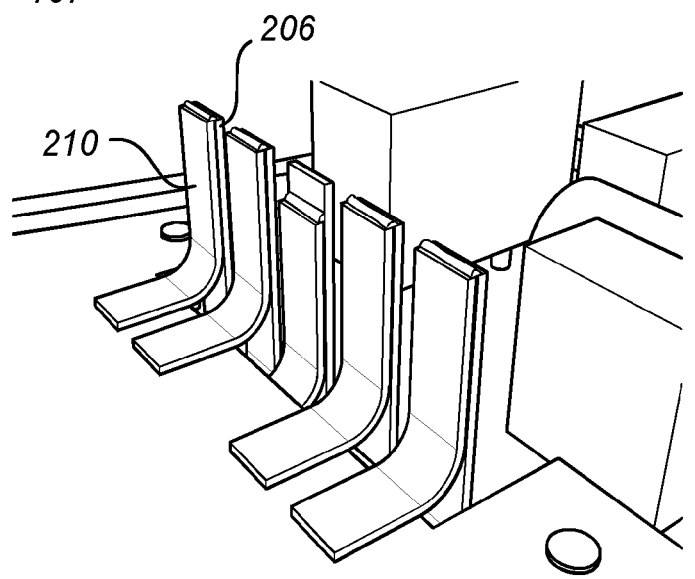
FIG. 2 illustrates a close up perspective of a board to board connection according to an exemplary embodiment of the invention.

Moving on to FIG. 2, which illustrates a closer perspective view of a board to board interconnection according to one exemplary embodiment of the invention. While it is not necessarily a close up of the lighting device illustrated in FIG. 1, the features are similar in FIG. 2. However, as this is not an exploded view it is illustrated how the board connectors 210 are biased against the driver connectors 206 and pair wise have an area of overlap. Furthermore, one board connector which is arranged on the opposite planar side of the circuit board has an end of its connection portion which rests lower on its paired driver connector's connection portion compared to the other board connectors. Furthermore, each board connector has been pair wise joined to its driver connector along the end of the flat connection portion of the board connector by means of a heat induced electrical interconnection method such as soldering or welding.

Figure 3:
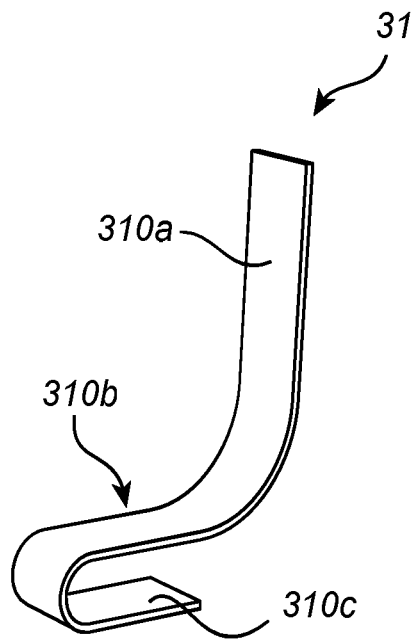
FIGS. 3-8 illustrate various alternative embodiments of a connector according to the invention.

FIG. 3 illustrates an alternative form of a connector according to an exemplary embodiment of the invention. The form may be equally used on a board connector or a driver connector, but for ease of reference the connector will be referred to as a board connector 310. Similarly to the board connectors illustrated in FIG. 1 and in FIG. 2 this alternative form board connector 310 is formed in one continuous strip of conducting material with resilient properties, having a connection portion 310a connected to a mounting portion 310c via a resilient portion 310b in the form of a bend. However, if viewed from the side so that the connection portion 310a extends upwards and the mounting portion 310c extends to the left of the connection portion, the resilient portion 310b further comprises a fold over the mounting portion 310c. Together, the resilient portion 310b and the mounting portion 310c, form the shape of a U turned 90 degrees clockwise.

Figure 4:
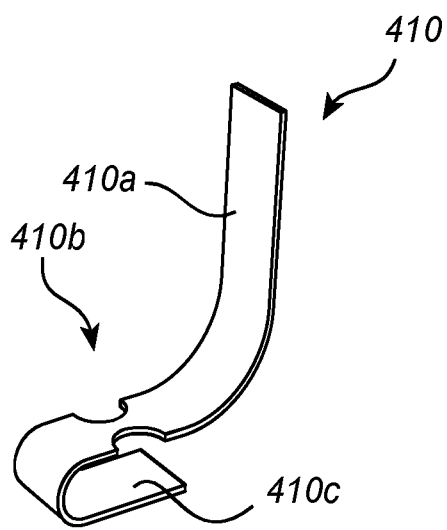

FIG. 4 illustrates another alternative form of a connector 410 according to an exemplary embodiment of the invention. The board connector 410 illustrated in FIG. 4 has the same shape as the board connector 310 illustrated in FIG. 3 if viewed from the side. However, some material has been removed from the resilient portion 410b. This material reduction is in the form of a locally reduced width of the strip.

Figure 5:
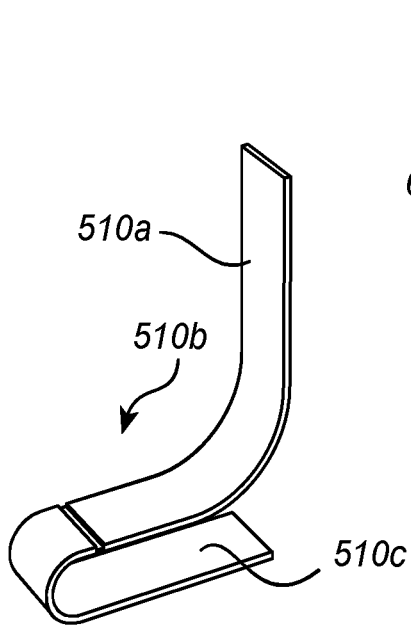

FIG. 5 illustrates another alternative form of a connector 510 according to an exemplary embodiment of the invention. The board connector 510 illustrated in FIG. 5 has the same shape as the board connector 410 illustrated in FIG. 4 if viewed from the side. However, the resilient portion 510b has a notch along the width of the strip.

Figure 6:
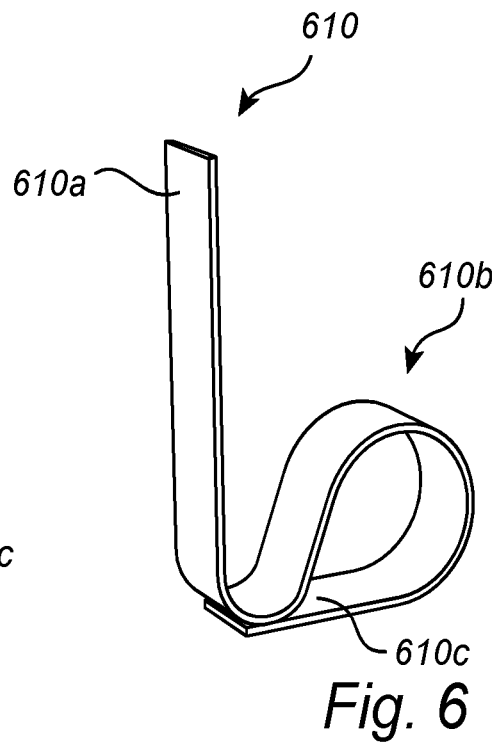

FIG. 6 illustrates another alternative form of a connector 610 according to an exemplary embodiment of the invention. The board connector 610 illustrated in FIG. 6 has a similar shape as the board connector 310 illustrated in FIG. 3 if viewed from the side. However, the U-shape is wider over the bend and the middle of the U-shape almost forming a circle, so that the shape resembles a tilted Omega-shape which then continues in the connection portion 610a extending upwards.

Figures 7, 8:
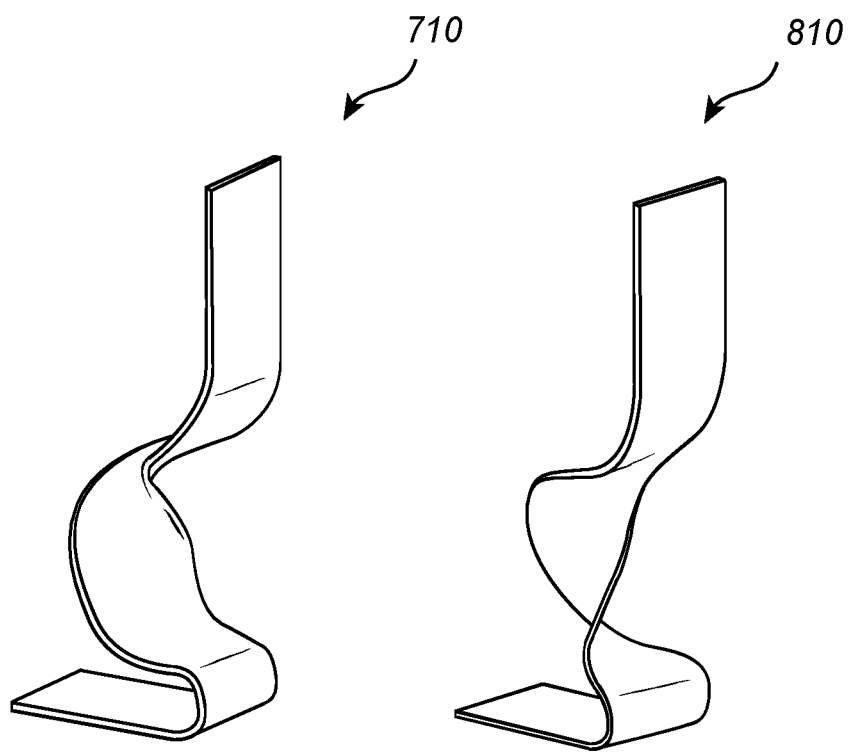

FIG. 7 and illustrates yet two alternative form of a connector 710 and 810 according to an exemplary embodiment of the invention. The connectors 710 and 810 illustrated in FIGS. 7 and 8 roughly have an L-shape similar to the board connectors illustrated in FIG. 1 and in FIG. 2. However, the connectors 710 and 810 are twisted clockwise and counterclockwise respectively 180° around the axis defined by the direction (D) at the bend extending to the connection portion in the upward direction (D).

FIGS. 3-8 illustrate different exemplary embodiments according to which the shape of the resilient portion may be modified in order to provide a tolerance against a force. Different bends, shapes, material reductions and twists may be used to increase tolerance in a predetermined direction. For example, in one embodiment the resilient portion of a driver connector may be provided with a U-shaped fold as illustrated in FIGS. 3-5 to allow a force of approximately 0.1 N pressing against the connection portion to allow a certain tolerance during the assembly process. Further parameters that may be used to design for a predetermined tolerance include material choice, general width and/or thickness of strip.

Even though the invention has been described with reference to specific embodiments thereof, many different alterations, modifications and the like will become apparent for those skilled in the art. For example, the driver electronics module and the circuit board may trade places or there may be two driver electronics modules or two circuit boards. Alternatively the driver electronics module and the circuit board may be arranged transverse to each other, with each board still having connectors with connection portions extending in coaxial directions. The connectors of one board may extend through an opening in the other board, wherein the connectors of the board with the opening are arranged at the inner edge of this opening. Any connector may comprise an alloy or be coated or lacquered to change parameters such as conductance and/or resilience. Furthermore, the interconnection of two opposite sides of a circuit board via two interconnected electronics connectors may be replaced by connecting two board connectors arranged to opposite sides of the board to the same electronics connector, wherein the electronics connector may comprise a wider strip to facilitate the connection. Parts of the system may be omitted, interchanged or arranged in various ways, the device yet being implemented according to the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. A single component or other unit may fulfill the functions of several items recited in the claims. The mere fact that certain measures are recited in mutually different dependent claims does not indicate that a combination of these measured cannot be used to advantage.

The invention claimed is:

1. An lighting device comprising:
a housing;
a circuit board arranged in said housing, said circuit board including a conducting path on a first side, and a board connector configured to provide electrical access to said conducting path;
at least one light source arranged on said circuit board and being in connection with said conducting path,
a driver electronics module arranged in said housing, said driver electronics module including driver circuitry for driving said light source(s) and an electronics connector configured to provide electrical access to said driver circuitry;
wherein said electronics connector and said board connector each have a flat connection portion which extends in a direction transverse to a planar extension of said circuit board,
wherein said connection portion of said board connector and said connection portion of said electronics connector are aligned so that they have an area of overlap,
wherein said connection portion of said board connector and said connection portion of said electronics connector are biased against each other such that there is at least a line of contact which provides a galvanic connection, and
wherein a heat induced electrical interconnection is provided along said line of contact.

2. The lighting device according to claim 1, wherein said board connector further comprises a mounting portion which is fixed in relation to said circuit board, and which is resiliently connected to said connection portion by means of a resilient portion.

3. The lighting device according to claim 1, wherein said electronics connector further comprises a mounting portion which is fixed in relation to said driver electronics module, and which is resiliently connected to said connection portion by means of a resilient portion.

4. The lighting device according to claim 1, wherein said board connector is formed in one piece of the same material.

5. The lighting device according to claim 1, wherein said electronics connector is formed in one piece of the same material.

6. The lighting device according to claim 1, wherein said board connector is arranged at an outer edge of said circuit board.

7. The lighting device according to claim 1, wherein said circuit board further comprises:
a second conducting path on a second side, and
a second board connector configured to provide electrical access to said second conducting path, said second board connector having a flat connection portion which extends in said direction
wherein said connection portion of said second board connector also is in electrical contact with said electronics connector, so that said first conducting path and said second conducting path are electrically connected via said electronics connector.

8. The lighting device according to claim 1, wherein said board connector is provided with a position indicating feature.

9. The lighting device according to claim 1, wherein said electronics connector is provided with a position indicating feature.

10. A method for assembling a lighting device comprising the steps of:
providing a housing, and a driver electronics module arranged in said housing, said driver electronics module including driver circuitry and a electronics connector configured to provide electrical access to said driver circuitry, said electronics connector having a flat connection portion which extends in a direction;
providing a circuit board including a conducting path on a first side and at least one light source arranged on said circuit board and being in connection with said conducting path, and a board connector configured to provide electrical access to said conducting path, said board connector having a flat connection portion which extends in a direction transverse to a planar extension of said circuit board;
aligning said circuit board and said housing so that said connection portion of said board connector and said connection portion of said electronics connector are parallel and aligned so that direction is coaxial with direction;
assembling said circuit board with said housing along an axis defined by said direction and direction by moving said circuit board so that said connection portion of said board connector and said connection portion of said electronics connector are slideably biased against each other during the movement;
joining said board connector to said electronics connector by means of a heat induced interconnection.

11. The assembly method according to claim 10, wherein said direction is transverse to a planar extension of said driver electronics module.

12. The assembly method according to claim 10, wherein said direction is parallel with a planar extension of said driver electronics module.

* * * * *